United States Patent
Yu et al.

(10) Patent No.: US 9,946,170 B2
(45) Date of Patent: Apr. 17, 2018

(54) METHOD FOR EXPOSURE AND DEVELOPMENT, SYSTEM FOR CONTROLLING EXPOSURE AND SYSTEM FOR EXPOSURE AND DEVELOPMENT

(71) Applicants: BOE Technology Group Co., Ltd., Beijing (CN); Hefei BOE Optoelectronics Technology Co., Ltd., Anhui (CN)

(72) Inventors: Xuequan Yu, Beijing (CN); Xianhua Xu, Beijing (CN); Zhi Liu, Beijing (CN); Zhiqiang Wang, Beijing (CN); Wei Zhang, Beijing (CN); Xuepei Cheng, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/129,507

(22) PCT Filed: Jun. 5, 2015

(86) PCT No.: PCT/CN2015/080884
§ 371 (c)(1),
(2) Date: Sep. 27, 2016

(87) PCT Pub. No.: WO2016/090874
PCT Pub. Date: Jun. 16, 2016

(65) Prior Publication Data
US 2017/0176873 A1      Jun. 22, 2017

(30) Foreign Application Priority Data

Dec. 12, 2014   (CN) .......................... 2014 1 0766896

(51) Int. Cl.
G03B 27/52   (2006.01)
G03B 27/42   (2006.01)
(Continued)

(52) U.S. Cl.
CPC ........ G03F 7/70775 (2013.01); G03F 7/7085 (2013.01); G03F 9/7046 (2013.01); G03F 9/7088 (2013.01)

(58) Field of Classification Search
CPC . G03F 9/7088; G03F 9/70; G03F 7/70; G03F 7/70425; G03F 2009/005;
(Continued)

(56) References Cited

U.S. PATENT DOCUMENTS

| | | | |
|---|---|---|---|
| 6,128,070 A | 10/2000 | Peng | |
| 2003/0211404 A1* | 11/2003 | Kim ................ | G03F 7/70433 430/5 |
| 2015/0192823 A1* | 7/2015 | Fu .................. | G03F 7/2022 216/23 |

FOREIGN PATENT DOCUMENTS

| CN | 1979344 A | 6/2007 |
|---|---|---|
| CN | 101872127 A | 10/2010 |

(Continued)

OTHER PUBLICATIONS

International Search Report and Written Opinion, including English translation of Box No. V of the Written Opinion, for International Application No. PCT/CN2015/080884, dated Sep. 17, 2015, 12 pages.

(Continued)

*Primary Examiner* — Mesfin Asfaw
(74) *Attorney, Agent, or Firm* — Westman, Champlin & Koehler, P.A.

(57) ABSTRACT

The present disclosure provides a method for exposure and development, a system for controlling exposure and a system for exposure and development. The method for exposure and development is configured to expose and develop a substrate when the substrate having a size larger than that of a mask. The method includes: exposing and developing a plurality of different regions of the substrate by means of the (Continued)

mask respectively, wherein the plurality of different regions are pieced to form an entire region which needs to be exposed and developed.

14 Claims, 9 Drawing Sheets

(51) Int. Cl.
*G03F 7/20* (2006.01)
*G03F 9/00* (2006.01)

(58) Field of Classification Search
CPC .... G03F 7/20; G03F 7/70275; G03F 7/70366; H01L 21/682; H01L 2223/54426; H01L 21/68; H01L 21/0274; H01L 21/0465
See application file for complete search history.

(56) References Cited

FOREIGN PATENT DOCUMENTS

| | | |
|---|---|---|
| CN | 101900933 A | 12/2010 |
| CN | 102449553 A | 5/2012 |
| CN | 103092005 A | 5/2013 |
| CN | 103189799 A | 7/2013 |
| CN | 103365124 A | 10/2013 |
| CN | 103869602 A | 6/2014 |
| CN | 104391431 A | 3/2015 |
| JP | 2013-175553 A | 9/2013 |

OTHER PUBLICATIONS

First Office Action, including Search Report, for Chinese Patent Application No. 201410766896.4, dated Jan. 4, 2016, 8 pages.

* cited by examiner

METHOD FOR EXPOSURE AND DEVELOPMENT, SYSTEM FOR CONTROLLING EXPOSURE AND SYSTEM FOR EXPOSURE AND DEVELOPMENT

CROSS-REFERENCE TO RELATED APPLICATION

This application is a Section 371 National Stage Application of International Application No. PCT/CN2015/080884, filed on Jun. 5, 2015, entitled "METHOD AND SYSTEM FOR EXPOSURE AND DEVELOPMENT METHOD, SYSTEM FOR CONTROLLING EXPOSURE", which has not yet published, and which claims priority to Chinese Application No. 201410766896.4, filed on Dec. 12, 2014, incorporated herein by reference in their entirety.

BACKGROUND OF THE INVENTION

Field of the Invention

The present disclosure relates to a technical field of display, more particular to a method for exposure and development, a system for controlling exposure and a system for exposure and development.

Description of the Related Art

A production process of a color filter substrate typically involves double exposures. One of them is used to form a black matrix and the other one is used to form a light filter layer and a spacer corresponding to respective sub-pixels. In the prior art, a mask which generally has the same size as the substrate (or a size slightly larger than that of the substrate), is used to expose the substrate by means of double marking alignment. Once a production line of the substrate is determined, the size of the mask is also typically fixed. In order to produce a color filter substrate having a larger size, the only way is to replace the production line for producing the mask, thereby causing a relatively high production cost.

SUMMARY

An object of the present application is to provide a method of exposure and development, a system for exposure and development and a corresponding controlling system, for a substrate having a size greater than that of a mask.

For this end, one aspect of the present application provides a method for exposure and development, configured to expose and develop a substrate when the substrate having a size larger than that of a mask, the method comprising:

exposing and developing a plurality of different regions of the substrate by means of the mask respectively, wherein the plurality of different regions are pieced together to form an entire region which needs to be exposed and developed.

Further, each of the plurality of different regions is at least adjacent to one edge of the substrate, and a substrate alignment mark corresponding to said region is produced at the edge of the substrate adjacent to said region, the substrate alignment mark corresponds to a mask alignment mark on the mask;

the step of exposing and developing a plurality of different regions of the substrate by means of the mask respectively comprises:

Step S11, determining an inclination angle of the substrate with respect to the mask on the basis of at least two substrate alignment marks, and adjusting the substrate or the mask so as to correct the inclination angle;

Step S12, adjusting the substrate or the mask with regard to each of the plurality of different regions, so that the substrate alignment mark on the substrate which corresponds to said region is aligned with the corresponding mask alignment mark on the mask.

Further, each of the plurality of different regions is at least adjacent to a first side edge or a second side edge of the substrate, the substrate alignment marks which correspond to respective regions are produced at the first or second side edge of the substrate; the corresponding mask alignment marks are produced at a first or second side edge of the mask; wherein a first side of the substrate corresponds to a first side of the mask, and a second side of the substrate corresponds to a second side of the mask, wherein the first side and the second side of the substrate or the mask are two opposite sides thereof;

the step S12 comprises:

with regard to the region of the plurality of different regions adjacent to the first side edge of the substrate, adjusting the substrate or the mask so that the substrate alignment mark corresponding to said region is aligned with the mask alignment mark at the first side of the mask;

with regard to the region adjacent to the second side edge of the substrate, adjusting the substrate or the mask so that the substrate alignment mark corresponding to said region is aligned with the mask alignment mark at the second side of the mask.

Further, the step of aligning the substrate alignment mark with the mask alignment mark in the step S12 comprises:

aligning a center of the substrate alignment mark with a center of the mask alignment mark.

Further, the substrate is produced with a black matrix, which defines a pattern of an opening portion of a sub-pixel;

after the step S12, the method further comprises:

step S13, with regard to a region of the plurality of different regions adjacent to the first side edge of the substrate, recognizing the pattern of the opening portion corresponding to the mask alignment mark at the second side edge of the mask, and aligning a center of the mask alignment mark at the second side edge of the mask with a center of the pattern of the corresponding opening portion; and/or with regard to a region of the plurality of different regions adjacent to the second side edge of the substrate, recognizing the pattern of the opening portion corresponding to the mask alignment mark at the first side edge of the mask, and aligning a center of the mask alignment mark at the first side edge of the mask with a center of the pattern of the corresponding opening portion.

Further, the step of recognizing the pattern of the opening portion corresponding to the mask alignment mark in the step S13 comprises:

recognizing the pattern of the opening portion corresponding to the center of the mask alignment mark on the basis of a pattern of an opening portion stored in advance.

Further, the mask alignment mark comprises a sub-pattern which is shaped as a Chinese character of 田, and an intersection point of a cross within the 田-shaped sub-pattern is at a center of the mask alignment mark, and the 田-shaped sub-pattern has the same size as that of the pattern of the opening portion;

The step of recognizing the pattern of the opening portion corresponding to the mask alignment mark in the step S13 comprises:

recognizing the pattern of the opening portion which corresponds to the intersection point of the cross in the 田-shaped sub-pattern of the mask alignment mark;

the step of aligning the center of the mask alignment mark with the center of the pattern of the corresponding opening portion in the step S13 comprises:

aligning the 田-shaped sub-pattern of the mask alignment mark with the pattern of the corresponding opening portion.

Further, the method further comprising covering a previously exposed region during a multiple exposure, so as to avoid exposing a same region repeatedly.

Another aspect of the present application also provides a system for controlling exposure, comprising:

a controlling module, configured to adjust a position of a mask with respect to a substrate when the substrate to be exposed and developed has a size larger than that of the mask, so that different regions of the substrate are exposed and developed by means of the mask respectively, and the different regions are pieced together to form an entire area which needs to be exposed and developed.

Further, the controlling module comprises:

an image recognition sub-module, configured to acquire an image containing a substrate alignment mark and a mask alignment mark, and recognize the substrate alignment mark on the substrate and the mask alignment mark on the mask in accordance with the acquired image;

a first adjustment sub-module, configured to determine an inclination angle of the substrate with respect to the mask on the basis of at least two substrate alignment marks on the substrate, and adjust the substrate or the mask so as to correct the inclination angle;

a second adjustment sub-module, configured to adjust the substrate or the mask with regard to each region of the different regions so that the substrate alignment mark on the substrate which corresponds to said region is aligned with the corresponding mask alignment mark on the mask.

Further, the image recognition sub-module is further configured to recognize a pattern of an opening portion corresponding to the mask alignment mark located at an exposure region when the substrate is produced with a black matrix, and the pattern of the opening portion is a pattern defined by the black matrix and used for forming a sub-pixel;

the controlling module further comprises:

a third adjustment sub-module, configured to align a center of the mask alignment mark located at the exposure region with a center of the pattern of the corresponding opening portion by adjusting them.

Further, the image recognition sub-module is configured to recognize the pattern of the opening portion where the center of the mask alignment mark is located on the basis of a pattern of an opening portion stored in advance.

Further, the mask alignment mark comprises a sub-pattern which is shaped as a Chinese character of 田, and an intersection point of a cross within the 田-shaped sub-pattern is a center of the mask alignment mark, and the 田-shaped sub-pattern has the same size as that of the pattern of the opening portion;

the third adjustment sub-module is further configured to recognize the pattern of the opening portion which corresponds to the intersection point of the cross in the 田-shaped sub-pattern of the mask alignment mark, and to align the 田-shaped sub-pattern of the mask alignment mark with the pattern of the corresponding opening portion.

Further, the controlling module is used to cover a previously exposed region during a multiple exposure, so as to avoid exposing a same region repeatedly.

A further aspect of the present application provides a system for exposure and development, comprising the system for controlling exposure as described above.

With the method for exposure and development, the system for controlling exposure, and the system for exposure and development, the plurality of different regions of the substrate are exposed respectively by the mask, and are pieced to form an entire region which needs to be exposed. In this way, the relatively large substrate is exposed and developed with a relative small mask. The method for exposure and development provided by the present application enable the color filter substrate having a relatively large size to be produced by a low generation production line, thereby improving the utilization ratio of the production line and reducing the production cost.

DETAINED DESCRIPTION OF PREFERRED EMBODIMENTS OF THE INVENTION

Below, embodiments of the present application will be described in detail with reference to the accompanying drawings and examples thereof. The following embodiments are only intended to more clearly explain the technical solutions of the present application, rather than limiting the scope of the present application.

The present application provides a method of alignment exposure or a method of exposure and development. A plurality of different regions on a substrate having a relatively large size are exposed and developed in sequence by using a mask having a relatively small size within this method. Therefore, the substrate having the relatively large size can be exposed and developed with the mask having the relatively small size. By using the method for alignment exposure provided by the present application, a low generation production line can be used to produce a color filter substrate having a design size of a generation production line which is larger than that of the low generation production line, thereby improving utilization of the production line, and reducing the production cost thereof. Of course, the method for alignment exposure provided by the present application can also be applied to produce other substrates having repetitive structures. Correspondingly, it can also achieve the same technical effect. The following explanation will be made with reference to only double exposures in the process for manufacturing the color filter substrate.

First Embodiment

Figure 1A:
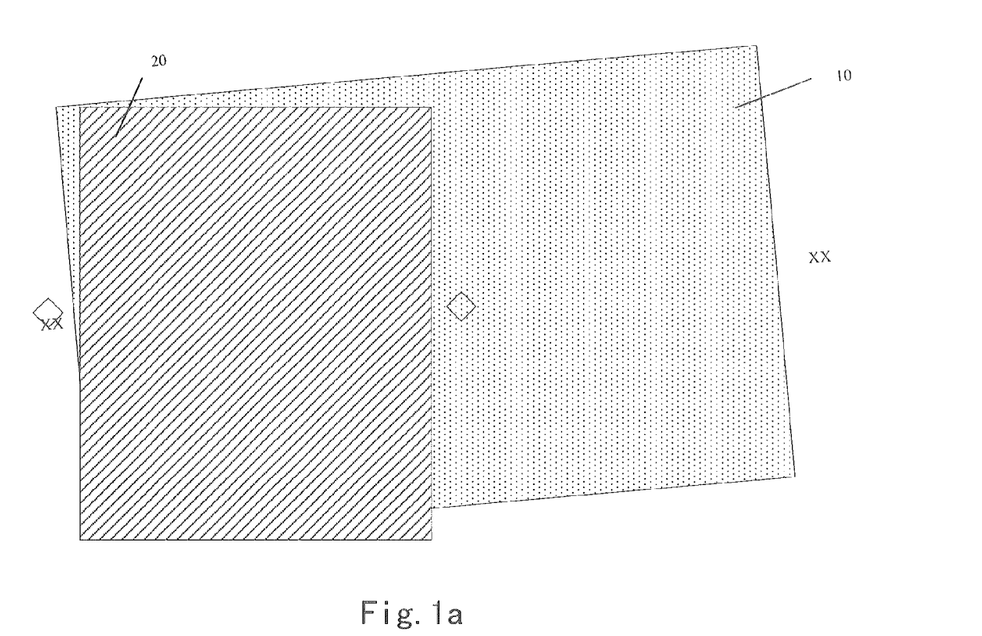
FIGS. 1a-1e are schematic views for showing positional relationships of a mask with respect to a substrate at different phases of a process of exposing the substrate with a method of exposure and development provided in accordance with a first embodiment of the present application.
Figure 2:
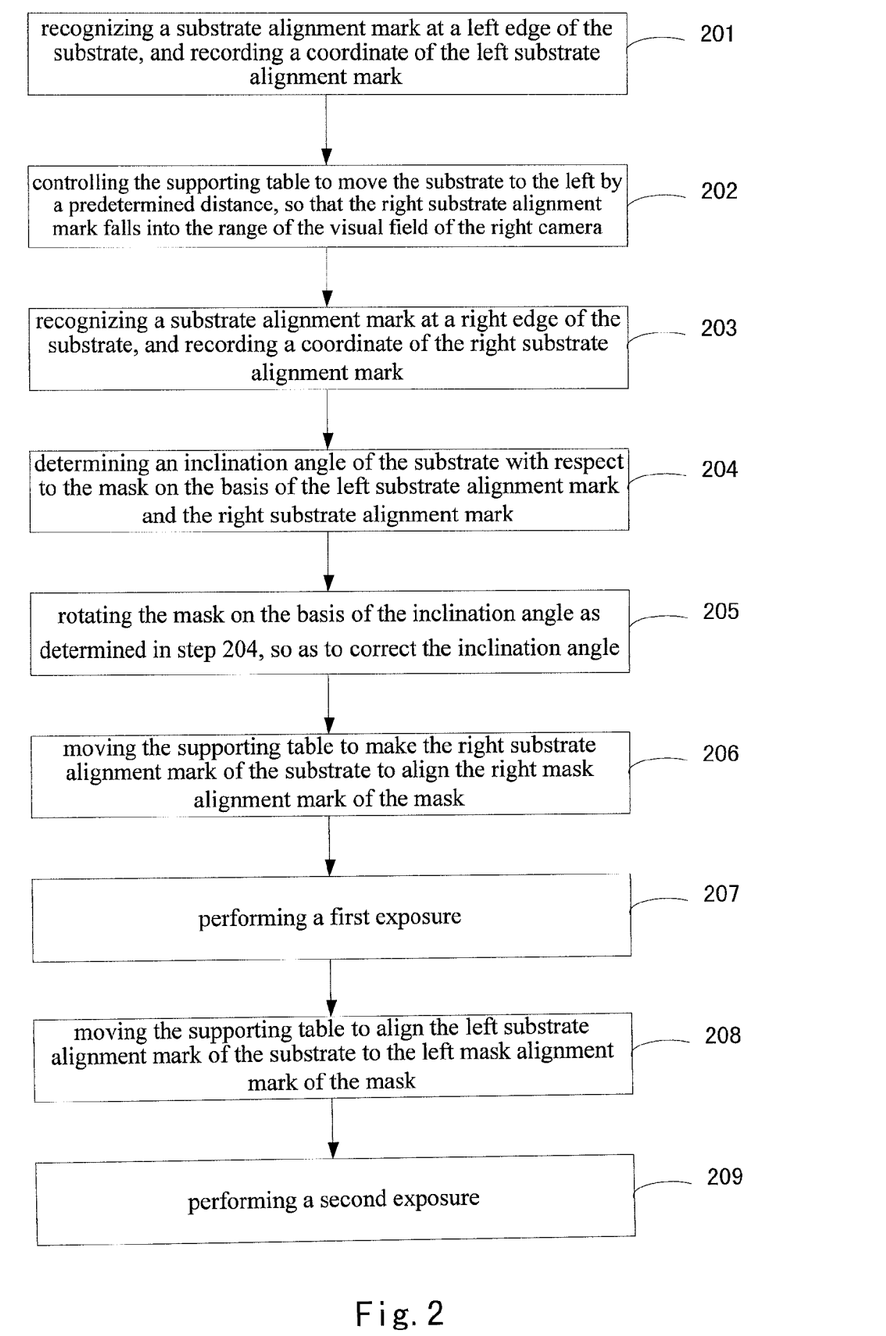
FIG. 2 is a schematic view for showing flows of a method of exposure and development provided in accordance with the first embodiment of the present application.

As shown in FIG. 1a, assuming that in the first embodiment of the present application a substrate (being marked as 10 in the figure) to be exposed has a vertical size identical with that of a mask (being marked as 20 in the figure), the substrate has a lateral size which is twice as much as that of the mask. Substrate alignment marks "XX" are produced at left and right sides of the substrate, and Mask alignment marks "◊" are produced at left and right sides of the mask (the figure only shows the marks and the regions to be exposed, a patterned region of the mask, and does not show edge portions thereof). After placing the substrate onto a supporting table, the substrate alignment mark at the left edge of the substrate falls into a range of visual field of a left camera in an exposure and development system to be used. The method for exposing and developing the substrate can specifically include as shown in FIG. 2:

Step 201, recognizing a (left) substrate alignment mark at a left edge of the substrate, and recording a coordinate of the left substrate alignment mark.

Generally, left and right cameras of the exposure and development system respectively align left and right mask alignment marks of the mask. At this time, in the embodiment of the present application, assuming that a center of the left mask alignment mark has a coordinate of (0, 0), a center of the right mask alignment mark has a coordinate of (L, 0), where the L indicates a width of the mask. Now, the left mask alignment mark can be used as a reference so as to acquire the coordinate (x1, y1) of the center of the left substrate alignment mark.

Step 202, controlling the supporting table to move the substrate to the left by a predetermined distance, so that the right substrate alignment mark falls into the range of the visual field of the right camera.

Figure 1B:
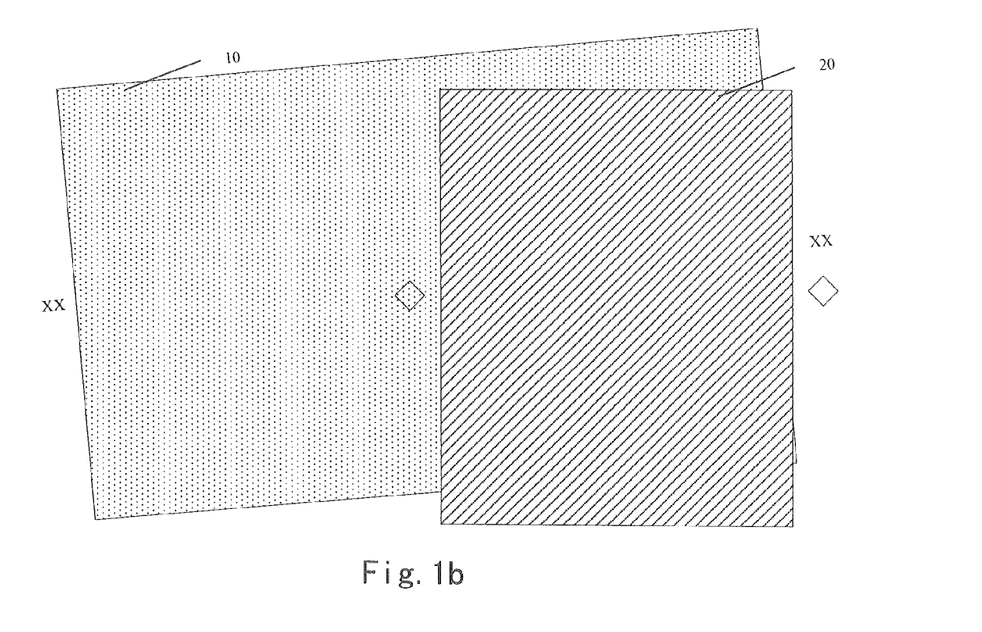

Specifically, the substrate is moved to the left by a distance of L, while the right substrate alignment mark will fall into the range of visual field of the right camera. After the step 202, a position relationship of the mask with respect to the substrate can be as shown in FIG. 1b.

Step 203, recognizing a (right) substrate alignment mark at a right edge of the substrate, and recording a coordinate of the right substrate alignment mark.

Specifically, the coordinate of the right substrate alignment mark can be determined based on the relative position of the right substrate alignment mark with respect to the right mask alignment mark, and it is assumed that the center of the right substrate alignment mark has a coordinate of (x2, y2).

Step 204, determining an inclination angle of the substrate with respect to the mask on the basis of the left substrate alignment mark and the right substrate alignment mark.

Specifically, the inclination angle of the substrate with respect to the mask can be determined on the basis of the position relationship of the mask alignment marks on the mask with respect to the left and right substrate alignment marks. The inclination angle α used herein can be calculated and formulated as:

$$\alpha = \arctan(y2-y1)/(x2-x1).$$

The step 205, rotating the mask on the basis of the inclination angle as determined in step 204, so as to correct the inclination angle.

Figure 1C:
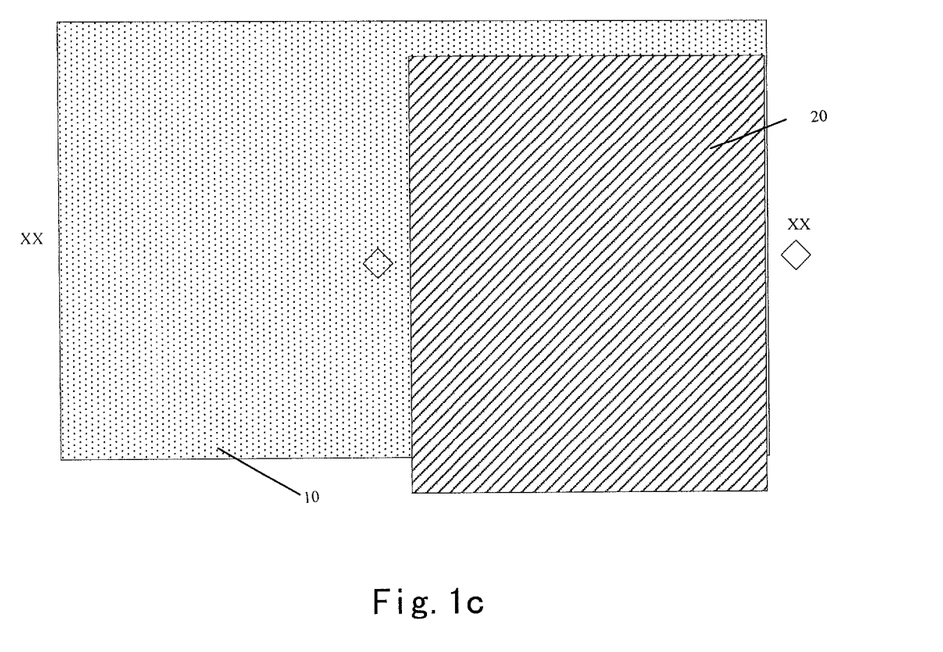

Of course, upon specifically implementing it, the supporting table can be rotated to correct the inclination angle. After the step 205, the position relationship between the mask and the substrate can be shown in FIG. 1c. In the present application, the term of correcting the inclination angle is meant to make the inclination angle between the substrate and the mask to be close to zero, by means of for example rotating them. It should be noted that, the inclination angle is meant to an angle between a connection line for connecting an alignment mark on the substrate with the corresponding alignment mark on the mask and another connection line for connecting another alignment mark on the substrate with the corresponding alignment mark on the mask when a plane where the substrate is located is parallel to a plane where the mask is located.

Step 206, moving the supporting table to make the right substrate alignment mark of the substrate to align the right mask alignment mark of the mask, and then performing a step 207.

Upon specifically implementing it, the supporting table is moved along an X axis, and then is moved along a Y axis; or it is moved along the Y axis and then is moved along the X axis. Of course, during the movement, the substrate shall be kept not to be rotated with respect to the mask. The term "aligning the substrate alignment mark with the mask alignment mark" used in the present embodiment is meant to align a geometrical center of the substrate alignment mark with a geometrical center of the mask alignment mark. Of course, in practice, when selecting the alignment marks having different shapes, it is also possible to use other alignment criterions to align the substrate alignment mark with the mask alignment mark.

Figure 1D:
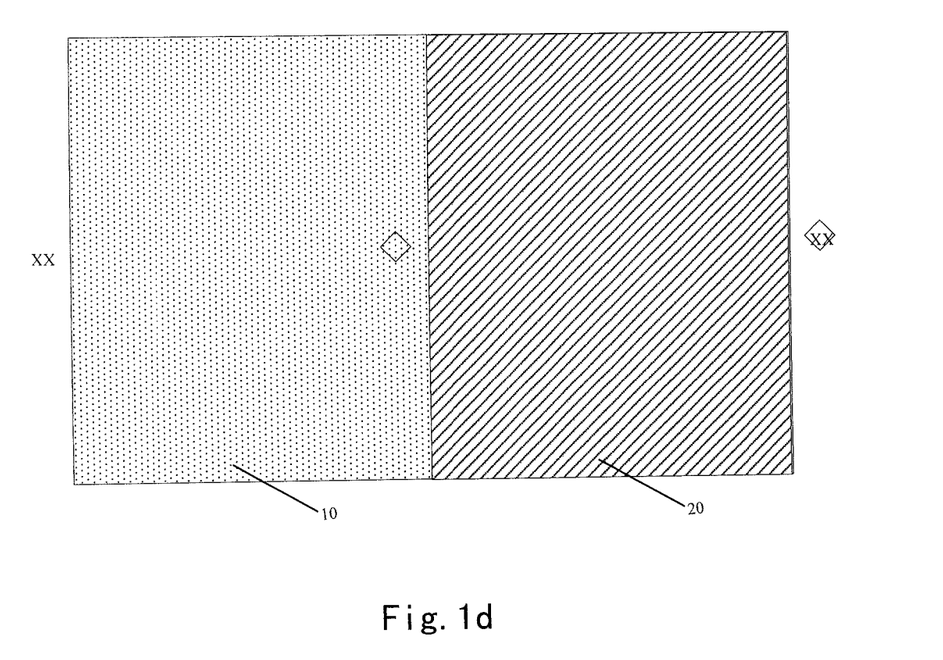

After the step 206, the relative position relationship between the mask and the substrate can be shown as in FIG. 1d.

Step 207, performing a first exposure.

Step 208, moving the supporting table to align the left substrate alignment mark of the substrate to the left mask alignment mark of the mask, and then performing a step 209.

Figure 1E:
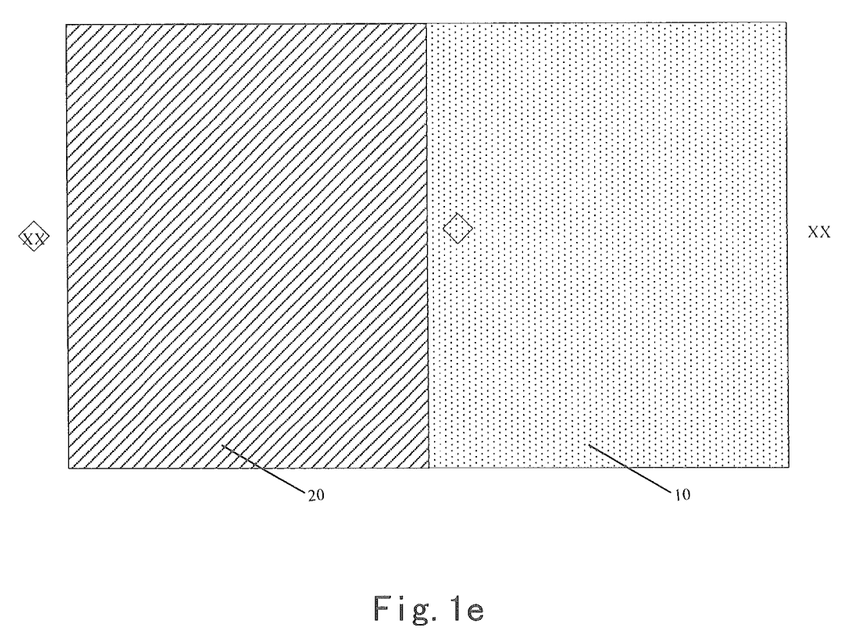

After the step 208, the relative position relationship between the mask and the substrate can be shown in FIG. 1e.

Step 209, performing a second exposure.

Up to now, the exposure to the entire substrate is finished.

In a specific application, the sequence of the steps 206-207 and the steps 208-209 can be interchanged. In a practical example, after the step 204 and before the exposure and development, the step 206 or 208 can be performed firstly, and then the slope is adjusted. The corresponding technical solution can also arrive at the same technical effect, which shall be considered to fall into the scope of the present application.

In the first embodiment of the present application, the different regions of the substrate having a larger size are exposed and developed by using a mask having a relatively small size in sequence, thereby finishing the exposure and development to the entire substrate (the regions which need to be exposed). In addition, in this embodiment of the present application, the inclination angle of the substrate with respect to the mask is calculated, and the substrate is adjusted depending on the calculated angle so as to accurately align the mask, thereby achieving the purpose of performing the exposure accurately.

Second Embodiment

Figure 3:
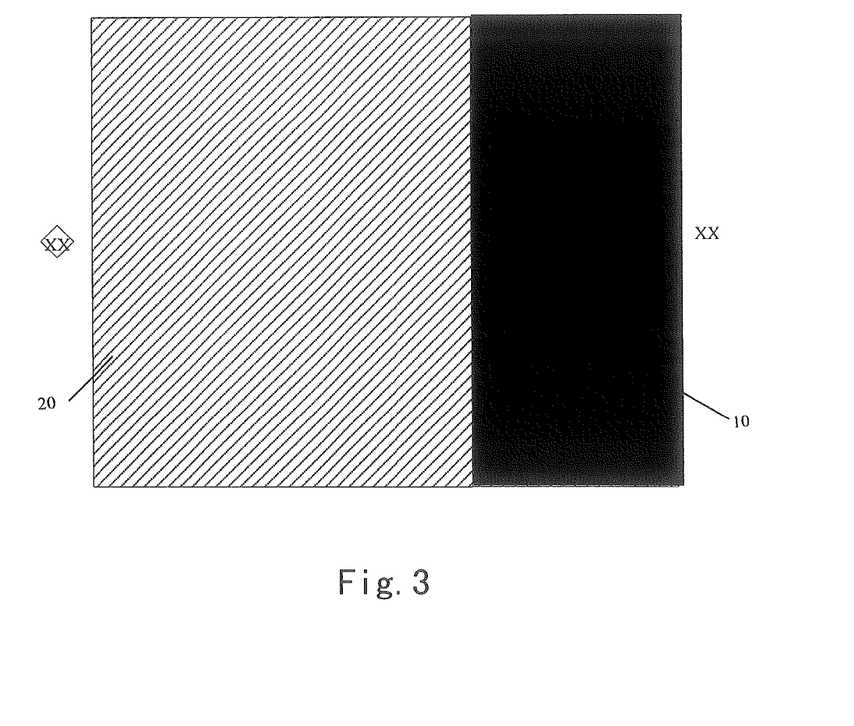
FIG. 3 is a schematic view for showing a positional relationship of the substrate with respect to the mask when performing a second exposure in a method of exposure and development provided in accordance with a second embodiment of the present application.

As shown in FIG. 3, the substrate to be exposed by the second embodiment of the present application is different from the substrate produced by the first embodiment, in that the former has a lateral size larger than that of the mask and less than twice that of the mask. At this time, when performing the second exposure, as shown in FIG. 3, the region which is performed by the first exposure can be covered, so as to avoid exposing the same region multiple times or repeatedly exposing the same region.

In addition, please be noted that in the first or second embodiment of the present application, although what is recorded is the case that the alignment marks are provided at the left and right edges of the substrate, in practice, the substrate alignment marks can also be produced at an upper edge and a lower edge of the substrate, and thus the mask alignment marks are corresponding produced at an upper edge and a lower edge of the mask, and the corresponding alignment exposure is finished. Therefore, the technical solution corresponding to this shall fall into the scope of the present application. In other words, the present application does not make any limitation to the arrangement of the substrate alignment mark and the mask alignment mark, as long as they can achieve the object of alignment. The above examples are only intended to make an explanation. Embodiments described later will show examples in which the alignment marks are set in other ways.

Third Embodiment

Figure 4:
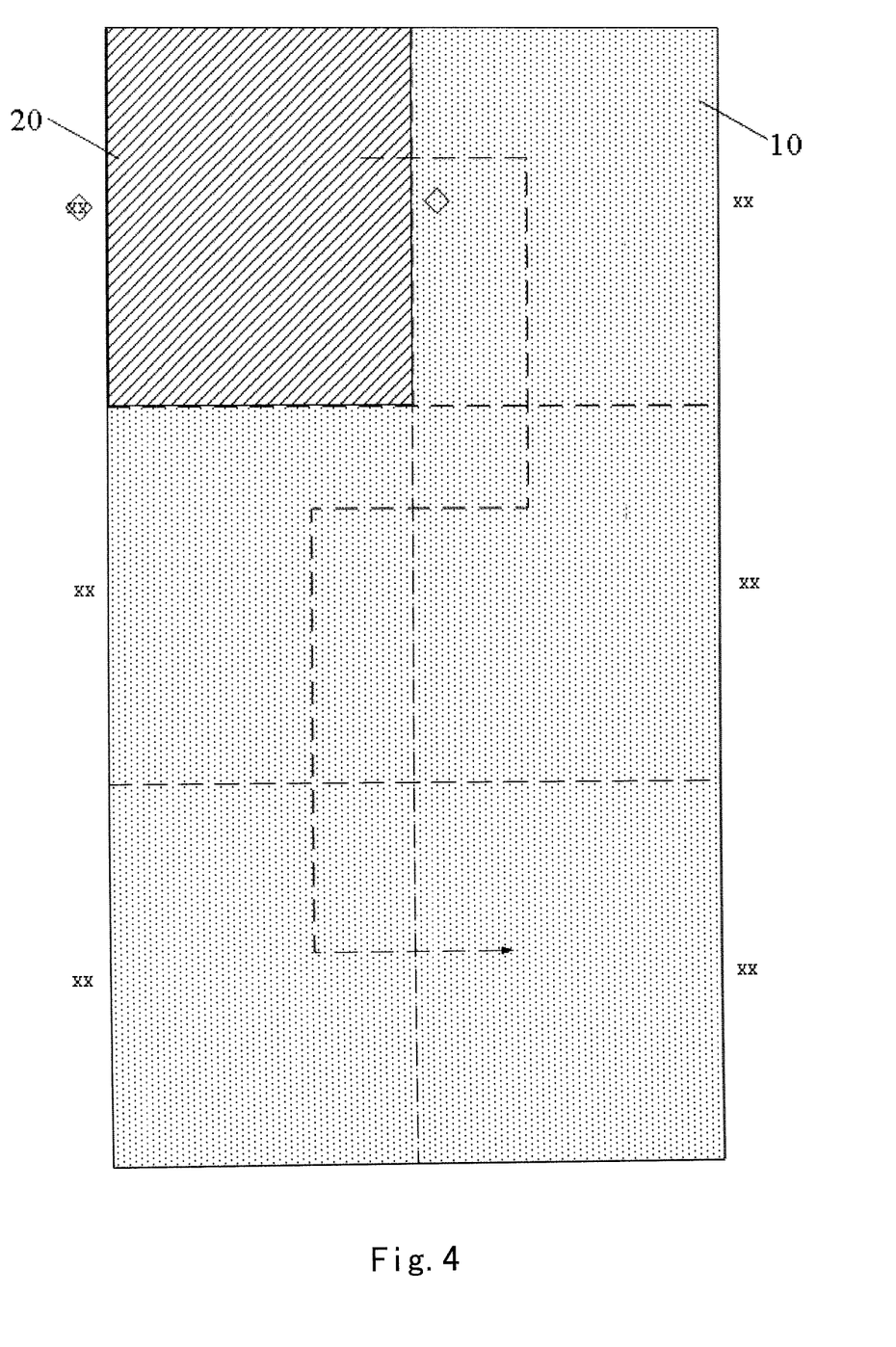
FIG. 4 is a schematic view for showing flows of a method of exposure and development provided in accordance with a third embodiment of the present application.

As shown in FIG. 4, the substrate to be exposed by the third embodiment of the present application is different from the substrate produced by the first embodiment in that the former has a vertical size triple that of the mask and a lateral size twice that of the mask. At this time, the exposure to the substrate can be finished by six procedures as shown by a direction of an arrow in the figure. Furthermore, before performing the exposure, it is necessary to produce six substrate alignment marks at two side edges of the substrate, and each substrate alignment mark corresponds to a region to be exposed by one exposure. The process for producing the substrate alignment marks can be finished when the black matrix is manufactured.

Fourth Embodiment

Figure 5:
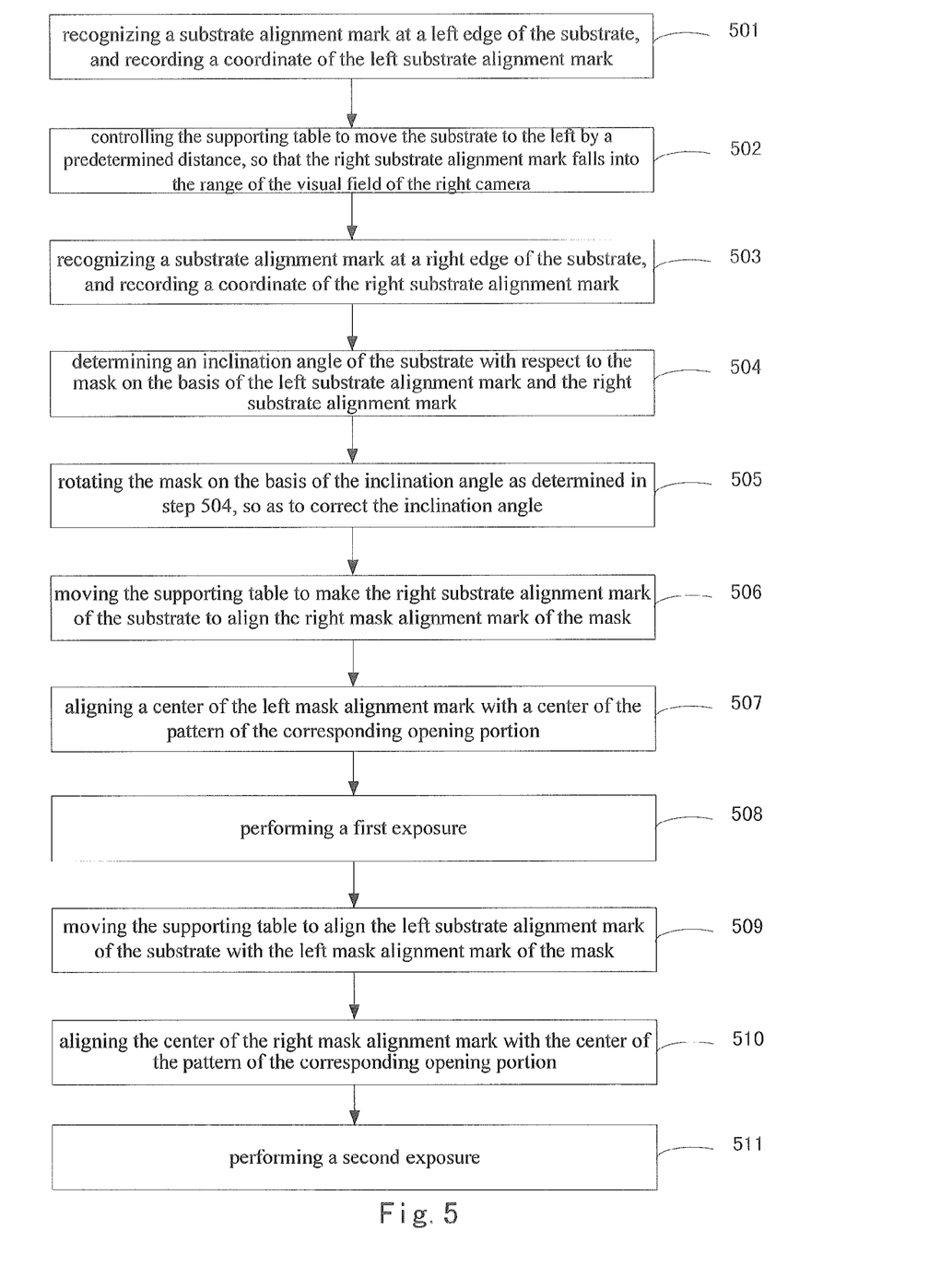
FIG. 5 is a schematic view for showing flows of a method of exposure and development provided in accordance with a fourth embodiment of the present application.

The difference of the method for exposure and development as provided by the fourth embodiment of the present application from the method for exposure and development as provided by the first embodiment, is to utilize a pattern of an opening portion corresponding to one sub-pixel as a second alignment mark, so as to more accurately align the mask with the substrate. The specific flows of the method, as shown in FIG. 5, include:

Steps 501-506, corresponding to the steps 201-206;

Step 507, recognizing the pattern of the opening portion corresponding to the left mask alignment mark on the basis of a pattern of a sub-pixel which is stored in advance, and aligning a center of the left mask alignment mark with a center of the pattern of the corresponding opening portion.

In practice, upon performing the step 507, the right mask alignment mark shall be kept to align with the right substrate alignment mark, and the substrate or the mask is rotated suitably so that the center of the left mask alignment mark is aligned with the center of the pattern of the corresponding opening portion. The pattern of the opening portion used herein is meant to the pattern for forming the sub-pixel and defined by the black matrix.

In practice, the pattern of the opening portion can be drawn and stored in advance. Upon recognizing, a coordinate of a center of the left mask alignment mark is calculated on the basis of the pattern of the left mask alignment mark, then a pattern of an opening portion on the substrate is recognized in the shot pattern starting from the center of the left mask alignment mark, in accordance with the stored pattern of the opening portion, and the left mask alignment mark falls into the recognized pattern of the opening portion. After that, the center of the recognized pattern of the opening portion is calculated, and the supporting table or the mask is moved so that the center of the left mask alignment mark corresponds to the center of the recognized pattern of the opening portion. Such solution is applicable to an alignment process which is achieved when the pattern of the mask alignment mark is simple.

Figure 6:
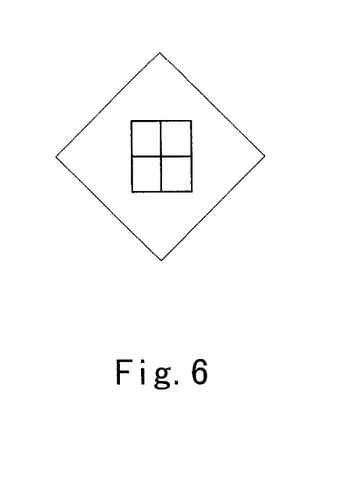
FIG. 6 is a schematic view of an alternative alignment mark for the mask provided in accordance with one embodiment of the present application.

In another alternative solution, as shown in FIG. 6, a sub-pattern which is shaped as a Chinese character of "田" (hereinafter called briefly as 田-shaped) is drawn at a center of the mask alignment mark. An intersecting point of the cross within the 田-shaped sub-pattern is at the center of the sub pattern, and the sub-pattern has the same size as that of the pattern of the opening portion.

At this time, the step of recognizing the pattern of the opening portion corresponding to the left mask alignment mark can be specified as: recognizing the pattern of the opening portion corresponding to the intersecting point of the cross in the 田-shaped sub-pattern of the left mask alignment mark. The step of aligning the center of the left mask alignment mark with the center of the pattern of the corresponding opening portion can be specified as: aligning the 田-shaped sub-pattern of the left mask alignment mark with the pattern of the corresponding opening portion. In this way, when recognizing the pattern of the sub-pixel, the pattern of the opening portion corresponding to the intersecting point of the cross in the 田-shaped sub-pattern is recognized. When performing the alignment, the sub-pattern of the left mark alignment mark is aligned with the pattern of the corresponding opening portion. Such alignment does not need any complicated calculation process, reduces the manufacturing difficulty of the corresponding control system, and is more accurate.

It should be understood that the pattern of the opening portion drawn in advance and the 田-shaped sub-pattern in the mask alignment mark have identical sizes as that of the pattern of the opening portion in the image which is shot by the CCD camera or a video camera. After aligning the pattern of the opening portion drawn in advance and the center of the 田-shaped sub-pattern manufactured in the mask alignment mark with the center of one opening portion obtained by the actual shooting, the pattern of the opening portion drawn in advance and the 田-shaped sub-pattern manufactured in the mask alignment mark shall neither fully fall into the pattern of one opening portion obtained by the actual shooting, nor shall exceed boundaries of the pattern of the one opening portion obtained by the actual shooting.

Step 508, performing a first exposure.

Step 509, moving the supporting table to align the left substrate alignment mark of the substrate with the left mask alignment mark of the mask.

Step 510, recognizing a pattern of an opening portion corresponding to the right mask alignment mark on the basis of the pattern of the opening portion stored in advance, and aligning the center of the right mask alignment mark with the center of the pattern of the corresponding opening portion.

Accordingly, during performing the step 510, the left mask alignment mark shall also be kept to align with the left substrate alignment mark.

Step 511, performing a second exposure.

Figure 7:
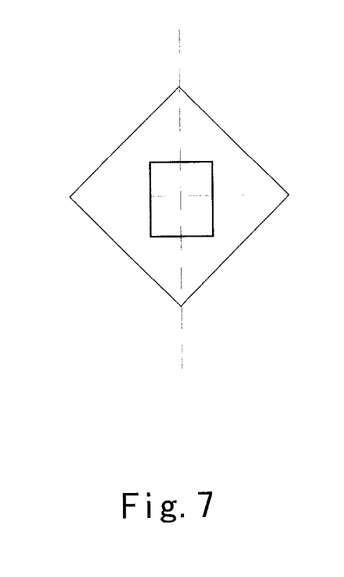
FIG. 7 is a schematic view for showing positions of the alignment mark of the mask and an opening portion after step 507 or step 510 in FIG. 5.

After the step 507 or step 510, a schematic view about the position of the mask alignment mark "◊" and the opening portion "□" is shown in FIG. 7.

Upon specifically implementing, in order to ensure the display effect, the alignment mark would not be produced onto the display region of the substrate (the region which needs to be exposed), and the mask and the substrate can only be aligned by a group of alignment marks. In the first embodiment of the present application, although it can ensure that the mask is substantially aligned with the substrate by adjusting the slope, there is still a likelihood of a relatively small error. On this basis, the method for exposure and development provided by the fourth embodiment of the present application utilizes one sub-pixel as a second alignment mark, which can achieve the more accurate alignment between the mask and substrate.

Fifth Embodiment

Figure 8:
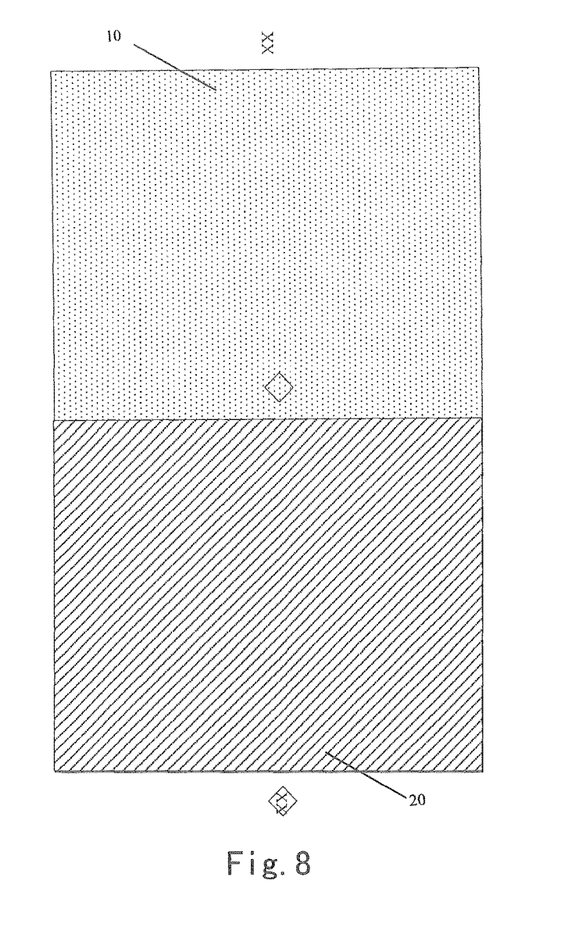
FIG. 8 is a schematic view for showing flows of a method of exposure and development provided in accordance with a fifth embodiment of the present application.

The difference of the substrate manufactured by the fifth embodiment of the present application from those of the first to fourth embodiments is that the vertical size thereof is twice that of the mask, and the lateral size of the substrate is identical with that of the mask. At this time, as shown in FIG. 8, one substrate alignment mark is produced at each of the upper edge and the lower edge of the substrate. Accordingly, the corresponding mask alignment marks are produced at the upper edge and lower edge of the mask. The alignment of the mask with the substrate can be achieved in consistent with the way as described in the first embodiment.

According to the technical solutions provided by the first to fourth embodiments of the present application, the person skilled in the art can understand that the respective regions to be exposed will be at least adjacent to the edge of the substrate as long as one of the lateral size and the vertical size of the substrate to be exposed and developed is not larger than twice that of the mask; and at this time the alignment of the mask with the corresponding regions of the substrate will be achieved by setting the substrate alignment mark at the edge of the substrate. Correspondingly, when the size of the substrate is not integral multiple of the size of the mask, the region which has been exposed and developed can be covered, so as to avoid repeatedly exposing. It should be understandable that when the size of the substrate is much greater than the size of the mask, it can be exposed and developed by the same way, not being limited to the case as described above.

As one alternative way, when performing each exposure, the region which will not be exposed at this exposure can be covered, so as to prevent the adjacent regions caused by the diffraction effect from being exposed.

It should be noted that although the alignment of the substrate with the mask is achieved by adjusting the slope of the substrate with respect to the mask and aligning one substrate alignment mark with one mask alignment mark only described in the first to fifth embodiments of the present application, in practice, the way for achieving the alignment of the substrate with the mask is not limited to this. When implementing the present application, the person skilled in the art can also adopt other ways for aligning the mask as actually required, and the technical solution corresponding to this shall also fall into the scope of the present application.

The present application also provides a system for exposure and development, which can be used to achieve the method for exposure and development as described above. The system for exposure and development includes:

a controlling module, configured to adjust a position of the mask with respect to the substrate when the substrate to be exposed and developed has a size larger than that of the mask, so that different regions of the substrate are exposed and developed by means of the mask respectively, and the different regions are pieced together to form all areas which need to be exposed and developed.

With the system for exposure and development provided by the present application, when the substrate to be exposed and developed is larger than the mask, the relative position of the mask with respect to the substrate is adjusted, a plurality of different regions of the substrate are exposed and developed by means of the mask respectively, and are pieced to form all the regions which need to be exposed and developed. The method for exposure and development provided by the present application can enable the color filter substrate having a relatively large size to be produced by a low generation production line, thereby improving the utilization ratio of the production line, and reducing the production cost thereof.

Figure 9:
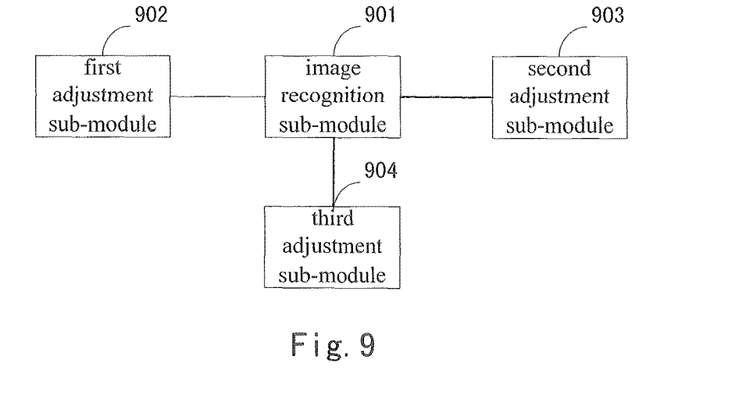
FIG. 9 is a schematic view for showing a structure of a system for exposure and development provided in accordance with an embodiment of the present application.

Further, as shown in FIG. 9, the controlling module specifically includes:

an image recognition sub-module 901, configured to acquire an image containing a substrate and a mask, and recognize a substrate alignment mark on the substrate and a mask alignment mark on the mask in accordance with the acquired image;

a first adjustment sub-module 902, configured to determine an inclination angle of the substrate with respect to the mask on the basis of at least two of the substrate alignment marks on the substrate, and adjust the substrate or the mask so as to correct the inclination angle;

a second adjustment sub-module 903, configured to adjust the substrate or the mask with regard to each region of the different regions so that the substrate alignment mark on the substrate which corresponds to the region is aligned with the corresponding mask alignment mark on the mask.

Further, the image recognition sub-module 901 is also configured to recognize a pattern of an opening portion corresponding to the mask alignment mark located at an exposure region, when the substrate is produced with a black matrix.

The controlling module also includes:

a third adjustment sub-module 904, configured to align a center of the mask alignment mark located at the exposure region with a center of the pattern of the corresponding opening portion by adjusting them.

Further, the image recognition sub-module 901 is configured to specifically recognize the pattern of the opening portion where the center of the mask alignment mark is located on the basis of a pattern of an opening portion stored in advance.

In addition, the controlling module covers the previously exposed region during the multiple exposure, so as to avoid exposing the same region repeatedly.

The present application also provides a system for exposure and development, including a system for exposure and development as described in any of the above embodiments.

Of course, in practice, said system for exposure and development might also include a motor for driving the mask or the substrate to move, the mask produced with a mask pattern, a supporting table for supporting the mask, a camera for acquiring an image, or the like. They will be not explained in detail herein.

The embodiments as described above are only preferred embodiments of the present application. It should be noted that as for those ordinarily skilled person in the art, improvements and modification can also be made without departing from the technical principle of the present application, which shall be considered to fall into the scope of the present application.

What is claimed is:

1. A method for exposure and development, configured to expose and develop a substrate when the substrate has a size larger than that of a mask, wherein the substrate is produced with a black matrix, which defines a pattern of an opening portion of a sub-pixel, the mask alignment mark comprises a sub-pattern which is shaped as a Chinese character of 田, and an intersection point of a cross within the 田-shaped sub-pattern is at a center of the mask alignment mark, and the 田-shaped sub-pattern has the same size as that of the pattern of the opening portion;

the method comprising:

exposing and developing a plurality of different regions of the substrate by means of the mask respectively, wherein the plurality of different regions are pieced together to form an entire region which needs to be exposed and developed, the step of exposing and developing the plurality of different regions of the substrate by means of the mask respectively including:

step S13, with regard to a region of the plurality of different regions adjacent to the first side edge of the substrate, recognizing the pattern of the opening portion corresponding to the mask alignment mark at the second side edge of the mask, and aligning a center of the mask alignment mark at the second side edge of the mask with a center of the pattern of the corresponding opening portion; and/or with regard to a region of the plurality of different regions adjacent to the second side edge of the substrate, recognizing the pattern of the opening portion corresponding to the mask alignment mark at the first side edge of the mask, and aligning a center of the mask alignment mark at the first side edge of the mask with a center of the pattern of the corresponding opening portion;

the step of recognizing the pattern of the opening portion corresponding to the mask alignment mark in the step S13 comprises:

recognizing the pattern of the opening portion which corresponds to the intersection point of the cross in the 田-shaped sub-pattern of the mask alignment mark;

the step of aligning the center of the mask alignment mark with the center of the pattern of the corresponding opening portion in the step S13 comprises:

aligning the 田-shaped sub-pattern of the mask alignment mark with the pattern of the corresponding opening portion.

2. The method according to claim 1, wherein each of the plurality of different regions is at least adjacent to one edge of the substrate, and a substrate alignment mark corresponding to said region is produced at the edge of the substrate adjacent to said region, the substrate alignment mark corresponds to a mask alignment mark on the mask;

before the step S13, the step of exposing and developing a plurality of different regions of the substrate by means of the mask respectively further comprises:

step S11, determining an inclination angle of the substrate with respect to the mask on the basis of at least two substrate alignment marks, and adjusting the substrate or the mask so as to correct the inclination angle;

step S12, adjusting the substrate or the mask with regard to each of the plurality of different regions, so that the substrate alignment mark on the substrate which corresponds to said region is aligned with the corresponding mask alignment mark on the mask.

3. The method according to claim 2, wherein each of the plurality of different regions is at least adjacent to a first side edge or a second side edge of the substrate, the substrate alignment marks which correspond to respective regions are produced at the first or second side edge of the substrate; the corresponding mask alignment marks are produced at a first or second side edge of the mask; wherein a first side of the substrate corresponds to a first side of the mask, and a second side of the substrate corresponds to a second side of the mask, wherein the first side and the second side of the substrate or the mask are two opposite sides thereof;

the step S12 comprises:

with regard to the region of the plurality of different regions adjacent to the first side edge of the substrate, adjusting the substrate or the mask so that the substrate alignment mark corresponding to said region is aligned with the mask alignment mark at the first side of the mask;

with regard to the region adjacent to the second side edge of the substrate, adjusting the substrate or the mask so that the substrate alignment mark corresponding to said region is aligned with the mask alignment mark at the second side of the mask.

4. The method according to claim 3, wherein the step of aligning the substrate alignment mark with the mask alignment mark in the step S12 comprises:

aligning a center of the substrate alignment mark with a center of the mask alignment mark.

5. The method according to claim 1, wherein the step of recognizing the pattern of the opening portion corresponding to the mask alignment mark in the step S13 comprises:

recognizing the pattern of the opening portion corresponding to the center of the mask alignment mark on the basis of a pattern of an opening portion stored in advance.

6. The method according to claim 1, further comprising covering a previously exposed region during a multiple exposure, so as to avoid exposing a same region repeatedly.

7. A system for controlling exposure, comprising:

a controlling module, configured to adjust a position of a mask with respect to a substrate when the substrate to be exposed and developed has a size larger than that of the mask, so that different regions of the substrate are exposed and developed by means of the mask respectively, and the different regions are pieced together to form an entire area which needs to be exposed and developed, wherein the mask alignment mark comprises a sub-pattern which is shaped as a Chinese character of 田, and an intersection point of a cross within the 田-shaped sub-pattern is at a center of the mask alignment mark, and the 田-shaped sub-pattern has the same size as that of the pattern of an opening portion of the substrate;

wherein the controlling module comprises an image recognition sub-module, configured to acquire an image containing a substrate alignment mark and a mask alignment mark, and recognize the substrate alignment mark on the substrate and the mask alignment mark on the mask in accordance with the acquired image, wherein the image recognition sub-module is further configured to recognize a pattern of an opening portion corresponding to the mask alignment mark located at an exposure region when the substrate is produced with a black matrix, and the pattern of the opening portion is a pattern defined by the black matrix and used for forming a sub-pixel;

the controlling module further comprises:

a third adjustment sub-module, configured to align a center of the mask alignment mark located at the exposure region with a center of the pattern of the corresponding opening portion by adjusting them; and to recognize the pattern of the opening portion which corresponds to the intersection point of the cross in the 田-shaped sub-pattern of the mask alignment mark, and to align the 田-shaped sub-pattern of the mask alignment mark with the pattern of the corresponding opening portion.

8. The system for controlling exposure according to claim 7, wherein the controlling module further comprises:

a first adjustment sub-module, configured to determine an inclination angle of the substrate with respect to the mask on the basis of at least two substrate alignment marks on the substrate, and adjust the substrate or the mask so as to correct the inclination angle; and a second adjustment sub-module, configured to adjust the substrate or the mask with regard to each region of the different regions so that the substrate alignment mark on the substrate which corresponds to said region is aligned with the corresponding mask alignment mark on the mask.

9. The system for controlling exposure according to claim 7, wherein the image recognition sub-module is configured to recognize the pattern of the opening portion where the center of the mask alignment mark is located on the basis of a pattern of an opening portion stored in advance.

10. The system for controlling exposure according to claim 7, wherein the controlling module is used to cover a previously exposed region during a multiple exposure, so as to avoid exposing a same region repeatedly.

11. A system for exposure and development, comprising the system for controlling exposure as claimed in claim 7.

12. The system for exposure and development according to claim 11, wherein the controlling module further comprises:

a first adjustment sub-module, configured to determine an inclination angle of the substrate with respect to the mask on the basis of at least two substrate alignment marks on the substrate, and adjust the substrate or the mask so as to correct the inclination angle; and a second adjustment sub-module, configured to adjust the substrate or the mask with regard to each region of the different regions so that the substrate alignment mark on the substrate which corresponds to said region is aligned with the corresponding mask alignment mark on the mask.

13. The system for exposure and development according to claim 11, wherein the image recognition sub-module is configured to recognize the pattern of the opening portion where the center of the mask alignment mark is located on the basis of a pattern of an opening portion stored in advance.

14. The system for exposure and development according to claim 11, wherein the controlling module is used to cover a previously exposed region during a multiple exposure, so as to avoid exposing a same region repeatedly.

* * * * *